United States Patent [19]

Hu et al.

[11] 4,015,249

[45] Mar. 29, 1977

[54] TRANSFER OF DOMAINS BETWEEN FIELDS

[75] Inventors: Hung Liang Hu, Sunnyvale; Laurence Lee Rosier, San Jose, both of Calif.

[73] Assignee: International Business Machines Corporation, Armonk, N.Y.

[22] Filed: Dec. 15, 1975

[21] Appl. No.: 640,356

[52] U.S. Cl. .......................................... 340/174 TF
[51] Int. Cl.² .......................................... G11C 19/08
[58] Field of Search ............................... 340/174 TF

[56] References Cited

UNITED STATES PATENTS

| | | | |
|---|---|---|---|
| 3,786,446 | 1/1974 | Bonyhard | 340/174 TF |
| 3,789,373 | 1/1974 | Bonyhard | 340/174 TF |

Primary Examiner—James W. Moffitt
Attorney, Agent, or Firm—Joseph E. Kieninger

[57] ABSTRACT

A system suitable to transfer a bubble domain from one field to a second field where the field is the largest area formed by exposing a pattern and which all of the dimensions are critical is disclosed. A magnetic domain is propagated out of the first field through an outlet into an inlet of the second field. In a preferred embodiment, the width of the outlet is one to ten bubble diameters and the width of the inlet opening is two to ten bubble diameters, the inlet opening being always at least as wide as the outlet opening. Associated with the inlet opening is a contracting means, for example, a Chevron pattern of decreasing height, which reduces the size of the domain to a size suitable for use in the bubble system in the second magnetic field.

14 Claims, 8 Drawing Figures

TRANSFER OF DOMAINS BETWEEN FIELDS

FIELD OF THE INVENTION

This invention relates to bubble domains and more particularly to the propagation of bubbles from one field to a second field.

BRIEF DESCRIPTION OF THE PRIOR ART

As the bubble domain technology advances there is more emphasis being placed on increasing the density of the bubble domain device. As the density of the bubble domain device increases and the size of the bubble domain approaches one micron and less in diameter, the present lithography exposure systems become a limiting factor. The limiting factor in the lithography technologies is the small number of lines available in a given exposure field. For example, the use of a conventional scanning electron beam system to provide the lithography yields a field containing about 2,000 lines which is substantially less than that required for practical one micron bubble devices. The field size is defined as the number of lines times the smallest line width in a given exposure. Hence as the width of the line decreases the size of the field decreases in direct proportion. For example, if the width of a line is decreased by one-third, the size of the field is decreased by one-third as well.

The common practice today is to use one exposure field to fabricate a single chip. As the bubble size is decreased, the chip size must be either decreased or multiple fields must be placed on the chip. Decreasing the chip size increases the cost for a given memory capacity due to the increased number of chip connections and electrical drive circuits.

Multiple fields on the same chip also increases the cost for a given memory capacity unless a bubble can be translated from one field to another field. Present lithography techniques do not have the capability to align the fields to permit translation in a controlled manner.

SUMMARY OF THE INVENTION

It is an object of this invention to provide an improved bubble system.

It is another object of this invention to use two or more fields.

It is another object of this invention to translate bubbles from one field to another field in a controlled manner.

It is yet another object of this invention to utilize a single detector or generator for more than one field.

These and other objects are accomplished by a bubble being propogated from a first field through an outlet into an inlet to a second field. The size of the inlet is at least two bubble diameters and preferably between two and ten bubble diameters in width. The outlet is between one and ten bubble diameters in width and is preferably the same size or smaller than the inlet. An example would be a bubble lattice in one field having an outlet sufficiently wide for one bubble to pass through. Adjacent to the first lattice is an inlet to a second bubble lattice in a second field. The inlet is five bubble diameters in width. As the bubble leaves the outlet and goes into the inlet, the bubble expands into a stripe having a length equal to that of the inlet opening, that is, the bubble expands perpendicular to the direction of translation.

Other objects of this advantage will be apparent from the following detailed description, reference being made to the accompanying drawings wherein preferred embodiments of the invention are shown.

DESCRIPTION OF THE ILLUSTRATIVE EMBODIMENTS

This invention is concerned with the joining or stitching of two or more fields of a bubble system together. As a result, a plurality of fields may be placed on a single chip thereby increasing the bit capacity of the chip. Examples of shift registers, major/minor loop devices, and bubble lattices being stitched or connected are shown in FIGS. 5, 6, 7 and 8 respectively, which will be hereinafter more fully described.

Figure 1:
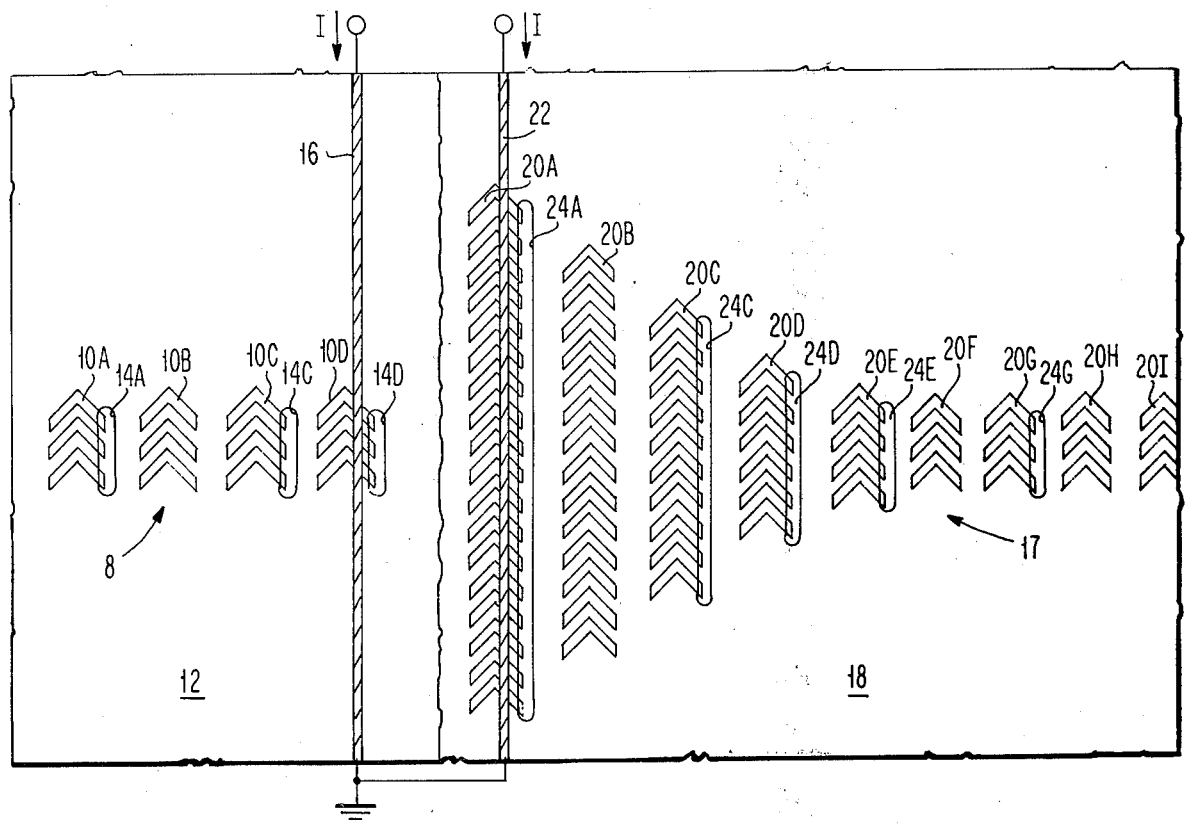
FIG. 1 is a schematic view of one mode of connecting two shift registers operating with isolated bubbles.

As shown in FIG. 1 a shift register 8 containing a chevron pattern 10A, 10B, 10C and 10D arranged in a horizontal row is positioned in a first field 12. Domain 14A is positioned on chevron 10A, domain 14C on chevron 10C and domain 14D on chevron 10D. By conventional field access techniques (not shown) in field 12 domains 14A and 14C are propagated towards the outlet chevron 10D. A conductor 16 is positioned perpendicular to the rows of chevrons 10A-D and crosses chevron 10D.

A second shift register 17 is positioned in second field 18 next to field 12. Shift register 17 includes a chevron pattern containing columns of chevrons. One portion of this chevron pattern contains columns of chevrons 20A, 20B, 20C, 20D and 20E. A second portion of the chevron pattern contains columns of chevrons having an equal number of chevrons therein and including 20F, 20G, 20H and 20I. A conductor 22 is positioned perpendicular to the row of chevrons 20A-I and crosses the length of chevron 20A. The stripe domain 24A is positioned along the edge of chevron column 20A, stripe domain 24C is positioned along the edge of chevron pattern 20C, stripe domain 24D along chevron column 20D, stripe domain 24E along chevron pattern 20E, and domain 24G along the edge of chevron pattern 20G.

In operation current is passed through conductor 16 in field 12 and through conductor 22 in field 18. The passage of current propagates the domain 14D in a direction perpendicular to the conductor 16 toward field 18. The domains will move to the next chevron pattern. Domain 14D will move from field 12 into field 18 to chevron column 20A. The domain 14D will expand lengthwise to the length of the chevron column 20A. The chevron pattern 10D is the outlet for field 12 and the chevron column 20A is the inlet for field 18. In FIG. 1 the outlet formed by chevron pattern 10D is about three bubble diameters in width. In general, the size of the outlet 10D is one bubble diameter or larger. As a practical matter, so as not to occupy too much space on the chip, the outlet opening size usually doesn't exceed ten bubble diameters. Although not shown if the outlet chevron column has a large number of chevrons therein, the chevron columns 10A, 10B, 10C may have different numbers of chevrons therein in much the same manner as the chevron patterns 20A, 20B, 20C and 20D have in field 18. For example, when outlet chevron column 10D has ten chevrons therein, chevron column 10C may have 8 chevrons therein, chevron pattern 10B has six chevrons therein and chevron column 10A has four chevrons therein.

The stripe domain 24A is propagated from the inlet chevron column 20A to the chevron column 20B by conventional field access techniques (not shown). The other stripe domains in the other chevron columns would also be pushed or translated to the next chevron column. The inlet chevron column 20A is at least two bubble diameters in width. As a practical matter so as to not use too much space on the chip, a size of 10 bubble diameters is usually not exceeded. The inlet 20A is at least as large as the outlet 10D opening. Preferably the inlet 20A is wider than the outlet 20D. This is necessary when the outlet 10D has a width of one bubble diameter. In that case the inlet 20A has to have an opening width of two bubble diameters. As the outlet opening 10D increases, the requirement for the inlet to be larger than the outlet decreases. When the size of the outlet is five or more bubble diameters, the size of the inlet and outlet may be substantially the same, although it is preferred that the inlet opening be somewhat larger than the outlet opening.

The movement of the domains in the direction of propagation is affected by the conductors 16 and 22. The movement of the domains in the direction perpendicular to the propagation direction is affected by the size of the chevron pattern 10D and the inlet chevron pattern 20A. The movement in the propagation direction and the movement in the direction perpendicular to the propagation direction provide a substantial margin for the alignment of fields 12 and 18. As a result there is no critical alignment problem with this system. For example, a domain can be stretched from two bubble diameters at the outlet 10D to ten bubble diameters at the inlet 20A. In addition, a bubble can be propagated with a conductor circuit such as 16 and/or 22 at least 16 bubble diameters away from the location of the conductor. The conductors 16 and 22 make alignment non-critical along the propagation direction. Since the inlet opening 20A is generally larger than the outlet opening 10D, alignment is non-critical along the direction perpendicular to the propagation direction.

Figure 2:
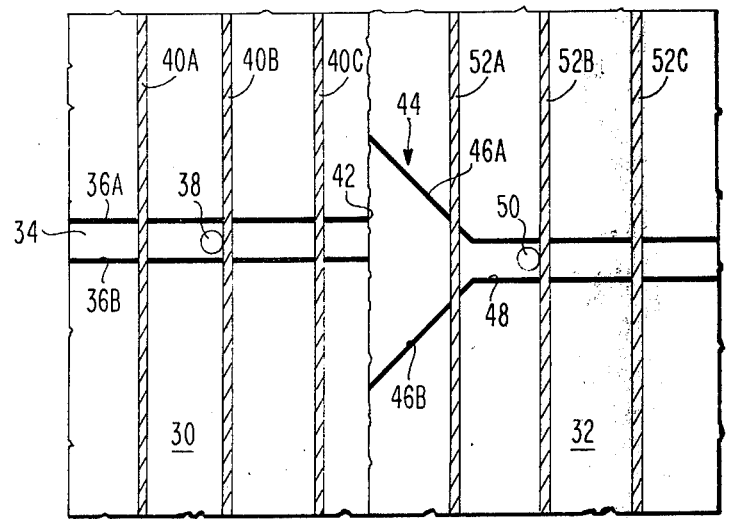
FIG. 2 is a schematic view of a second mode of connecting two shift registers operating with isolated bubbles.

As shown in FIG. 2 field 30 is stitched or connected to field 32. In field 30 a bubble domain path 34 is formed by barriers 36A and 36B. The bubble 38 is propagated in bubble path 34 by conductors 40A, B or C as the case may be until it is forced out of field 30 through the outlet 42. After the bubble leaves the outlet 42 it passes into the inlet 44 in field 32. The inlet 44 is substantially larger than the outlet 42. As a result the alignment of field 30 and field 32 in the direction perpendicular to the path 34 is not critical. The inlet 44 is formed by a retaining means such as a groove or a dam and has tapered sides 46A and 46B which lead to a bubble path 48. When the bubble leaves field 30 through outlet 42 into inlet 44 the bubble domain expands into a stripe to conform with the length of the inlet opening 44.

The barrier wall 46A and 46B may be dams, grooves, conductors or equivalent means as is well known in the art. The retaining means 46A and 46B are shaped in the form of a funnel which reduces the size of the stripe domain to a bubble domain, for example, 50, in bubble path 48. Passing current in conductors 52A, 52B and 52C move the bubble in the bubble path 48 as is well known in the art.

Figure 3:
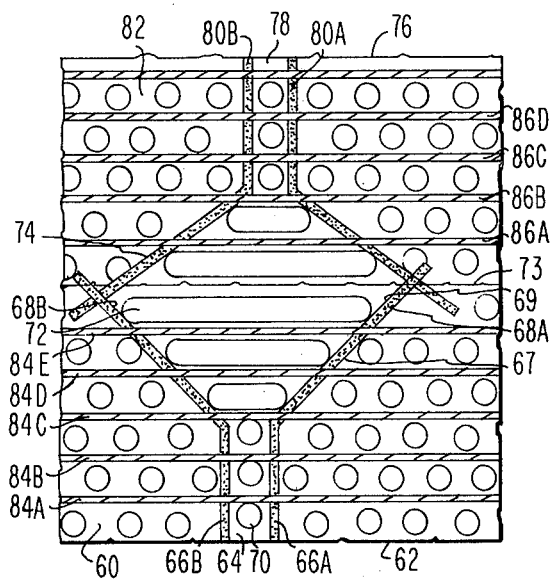
FIG. 3 is a schematic view of one mode of connecting two bubble lattice systems.

This invention can be readily adapted for use in the stitching of accessing channels between lattices in two different fields as is shown in FIG. 3. An environment 60 which may contain bubbles and/or stripes in field 62 contains a channel of bubbles 64. The access channel of bubble 64 is positioned between dams 66A and 66B. Dams 66A and 66B diverge into dams 68A and 68B, respectively, to form a funnel-shape 67. Bubbles 70 in column 64 expands as they reach this funnel-shape 67 to conform with the distance between the dams 68A and 68B. The expanded bubble domains become stripe domains 72 and the length of the stripe domains may be two bubble diameters or more. For practical reasons the stripe domain length is preferably not greater than 10 bubble diameters at the outlet end 69 of the funnel-shape 67 at the end of field 62.

An inlet 73 to a funnel-shape 74 in field 76 is positioned next to the outlet end 69 of funnel-shape 67 to receive the expanded stripe domain 72. The walls of the funnel-shape inlet 74 taper down so that the stripe domain 72 shrinks or contracts to the size of a bubble to be moved in channel 78 which is surrounded by dams or grooves 80A and 80B in environment 82 which may contain bubbles and/or stripes. The conductor lines 84A, 84B, 84C, 84D and 84E in field 62 and conductor lines 86A, 86B, 86C and 86D in fields 76 are used to move the bubbles and the stripe domains in the two fields.

Figure 4:
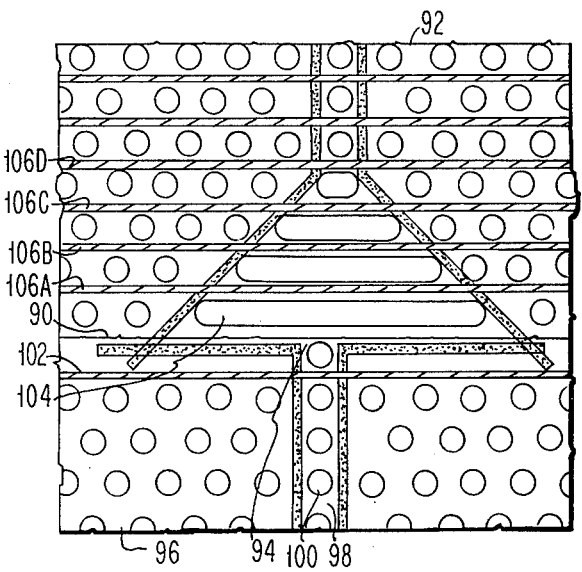
FIG. 4 is a schematic view of a second mode of connecting two bubble lattices.

Another embodiment of this invention in a bubble lattice environment is shown in FIG. 4. The inlet 90 in field 92 is substantially as that described in FIG. 3. The outlet 94 in field 96 is the end of the channel 98. Bubbles 100 are propagated up the channel 98 to the outlet 94 by means of conductors not shown. Conductor 102 will move the bubble at the outlet 94 into the inlet 90 where the bubble expands into a stripe domain 104. The conductors 106A, 106B, 106C and 106D propagate the stripe domains 104 and the bubbles in the same manner as described in FIG. 3.

Figure 5:
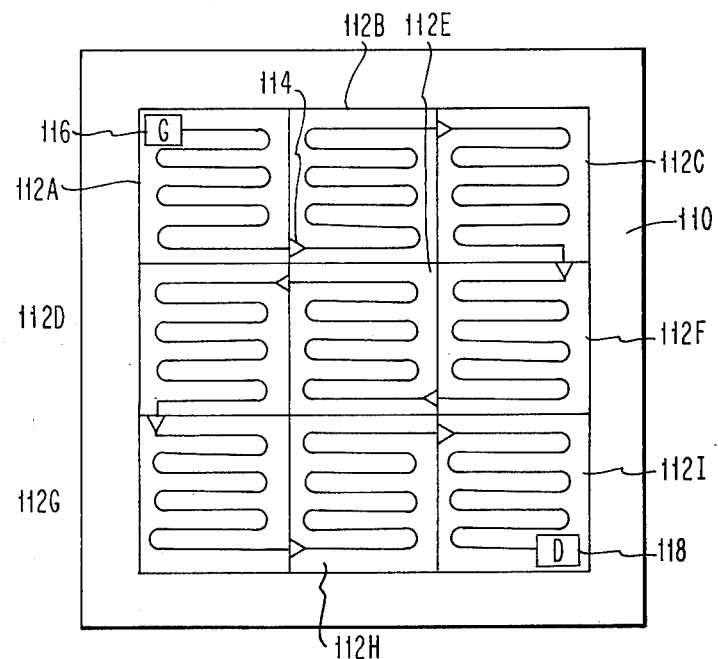
FIG. 5 is a schematic view of a chip having nine shift registers connected.

In FIG. 5 a chip 110 contains 9 shift registers 112A-I. Each shift register is in a separate field. Shift register 112A is connected at 114 to shift register 112B. The connecting means 114 are of the type described in FIG. 1 or in FIG. 2. Similarly, 112B is connected to 112C which in turn is connected to 112F which is connected to 112E and so on as shown in the drawing until 112H is connected to 112I. In this manner all of the shift registers 112A through 112I are connected in series to form a large single register. A generator 116 in shift register 112A will generate bubbles which can be propagated by means well known in the art to any of the other shift registers. A detector 118 in shift register 112I is used to determine the presence or absence of a bubble in any of the individual shift registers.

Figure 6:
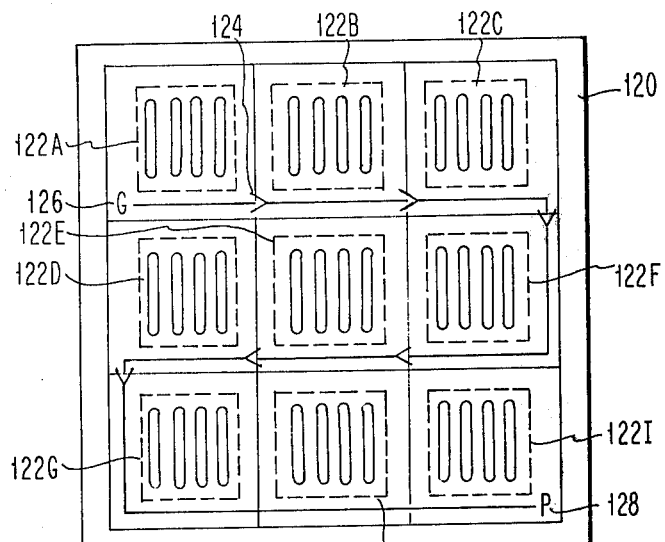
FIG. 6 is a schematic view of a chip having nine major/minor loop devices in which the major loops of the nine devices are connected.

In FIG. 6 a chip 120 contains 9 major/minor loop devices 122A through 122I. Device 122A is connected to device 122B by connecting means 124 which is of the type described in either FIG. 1 or FIG. 2. Similarly, device 122B is connected to 122C. Device 122C is connected to device 122F. Device 122F is connected to device 122E which in turn is connected to device 122D. Device 122D is connected to device 122G which is connected to device 122H which in turn is connected to device 122I. A generator 126 generates bubbles in device 122A. A detector 128 detects the presence or absence of bubbles in device 122I. It is understood that the devices in FIG. 3 and FIG. 4 may be connected in ways other than that described in these two figures.

Figure 7:
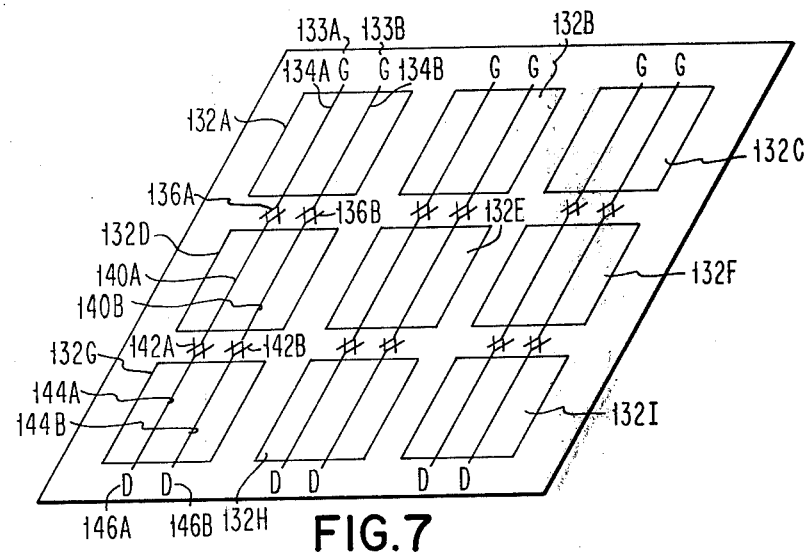
FIG. 7 is a schematic view of a chip having nine bubble latttices in which three of the bubble lattices are connected to one another.

In FIG. 7 a chip 130 contains 9 bubble lattices 132A through 132I. Generator 133A and 133B generate bubbles which are translated into columns 134A and 134B respectively in lattice 132A. The bubbles are translated from lattice 132A down these column by means well known in the art into connecting means 136A and 136B. These connecting means are of the type described in FIGS. 3 or 4 or they may be variations thereof. The connecting means 136A and 136B are surrounded by a lattice environment (not shown). The bubbles are translated from connecting means 136A and 136B into columns 140A and 140B in bubble lattice 132D. The bubbles are translated from bubble lattice 132D by connecting means 142A and 142B into columns 144A and 144B in bubble lattice 132G. Connecting means 142A and 142B are also surrounded by a lattice environment (not shown). Bubbles are translated down columns 144A and 144B into detectors 146A and 146B where the state of the bubble is detected. Similar means will generate, connect and detect bubbles in lattices 132B, E and H and in lattices 132C, F and I.

Figure 8:
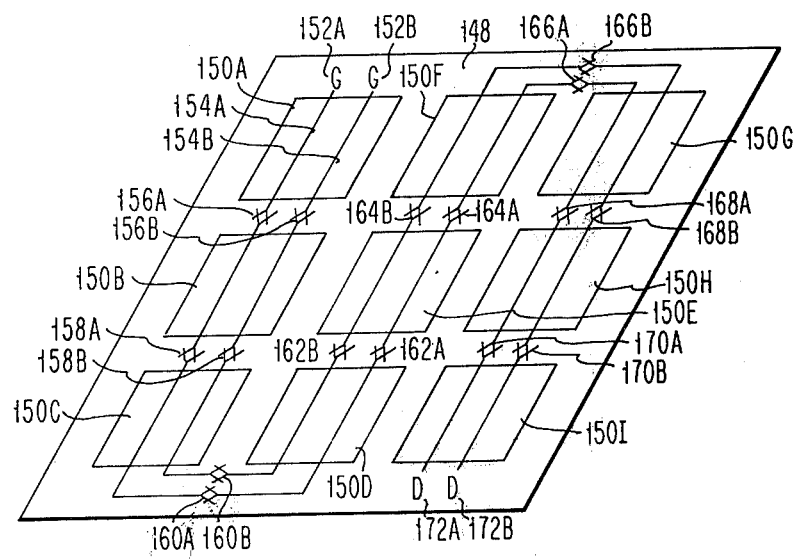
FIG. 8 is a schematic view of a chip having nine bubble lattices connected.

In FIG. 8 a chip 148 contains 9 fields (not shown) including the bubble lattices 150A through 150I. Generators 152A and 152B generate bubbles which are translated into columns 154A and 154B respectively in lattice 150A. The bubbles are translated from lattice 150A into connecting means 156A and 156B. These connecting means are of the type described in FIGS. 3 or 4 or variations thereof. The connecting means 156A and 156B are surrounded by a lattice environment (not shown). The bubbles are translated from connecting means 156A and 156B into lattice 150B. Similarly, bubbles from lattice 150B are translated through connecting means 158A and 158B to lattice 150C, through 160A and 160B to lattice 150D, through 162B and 162A to lattice 150E, and through 164A, 164B, 166A, 166B, 168A, 168B, 170A and 170B to lattices 150E, 150F, 150G, 150H and 150I respectively. Bubbles are translated from lattice 150I to detectors 172A and 172B to determine the state of the bubbles.

Although several preferred embodiments of this invention have been described it is understood that numerous variations may be made in accordance with the principles of this invention.

I claim:

1. The combination adapted to move a magnetic domain from an outlet in a first field to a second field comprising
    outlet means from a first field,
    propagation means in said first field adapted to move a domain in a first direction out of said field through said outlet means,
    inlet means to a second field positioned next to said outlet means wherein a domain leaving said outlet means enters said inlet means, and
    propagation means in said second field adapted to move a domain in said first direction.

2. The combination as described in claim 1 wherein said inlet means is at least 2 bubble diameters in width.

3. The combination as described in claim 1 wherein said inlet means is between 2 and 10 bubble diameters in width and at least as wide as said outlet means.

4. The combination as described in claim 1 wherein said inlet means is at least 1 bubble diameter wider than said outlet means.

5. The combination as described in claim 1 wherein said outlet means is 1 to 10 bubble diameters in width.

6. The combination as described in claim 1 wherein said inlet means and said outlet means are non-critically aligned.

7. The combination adapted to move a domain from an outlet in a first field to a second field comprising
    outlet means in a first field,
    propagation means in said first field adapted to move a domain in a first direction out of said field through said outlet means,
    inlet means to a second field positioned next to said outlet means wherein a bubble leaving said outlet means enters said inlet means,
    propagation means in said second field adapted to move a domain in said first direction, and
    contracting means in said second field associated with said inlet means and adapted to reduce the size of the domain in said inlet means to a bubble domain suitable for use in said second field.

8. The combination as described in claim 7 wherein said contracting means include chevron means.

9. The combination as described in claim 7 wherein said contracting means include a funnel-shaped structure adapted to confine domains.

10. The combination as described in claim 7 including expanding means in said first field associated with said outlet means and adapted to increase the length of the bubble domain.

11. The combination as described in claim 10 wherein said expanding means include a funnel-shaped structure adapted to confine domains.

12. A bubble system comprising
    a first bubble lattice in a first field having an outlet means, said outlet means being 1 to 10 bubble diameters wide,
    a second bubble lattice in a second field having an inlet means, said inlet means positioned next to said outlet means wherein a domain leaving said outlet means enters said inlet means, said inlet means being 2 to 10 bubble diameters wide and at least as wide as said outlet means, and
    contracting means in said second field associated with said inlet means and adapted to reduce the size of the domain in said inlet means to a bubble domain suitable for use in said second lattice.

13. A bubble system comprising
    a first shift register in a first field having an outlet means, said outlet means being 1 to 10 bubble diameters wide,
    a second shift register in a second field having an inlet means, said inlet means positioned next to said outlet means wherein a domain leaving said outlet means enters said inlet means, said inlet means being 2 to 10 bubble diameters wide and at least as wide as said outlet means, and contracting means in said second field associated with said inlet means and adapted to reduce the size of the domain in said inlet means to a bubble domain suitable for use in said second shift register.

14. A bubble system comprising a first major loop in a first field having an outlet means, said outlet means being 1 to 10 bubble diameters wide, a second major loop in a second field having an inlet means, said inlet means positioned next to said outlet means wherein a domain leaving said outlet means enters said inlet means, said inlet means being 2 to 10 bubble diameters wide and at least as wide as said outlet means, and contracting means in said second field associated with said inlet means and adapted to reduce the size of the domain in said inlet means to a bubble domain suitable for use in said second major loop.

* * * * *